United States Patent
Vang (10) Patent No.: US 6,828,796 B2
(45) Date of Patent: Dec. 7, 2004

(54) ELECTRICAL CONTINUITY TESTER

(76) Inventor: Lue Vang, 3444 Forestbrook Dr., #E, Charlotte, NC (US) 28208

( * ) Notice: Subject to any disclaimer, the term of this patent is extended or adjusted under 35 U.S.C. 154(b) by 16 days.

(21) Appl. No.: 10/374,264

(22) Filed: Feb. 27, 2003

(65) Prior Publication Data

US 2004/0169517 A1 Sep. 2, 2004

(51) Int. Cl.[7] ............................................. G01R 31/00
(52) U.S. Cl. ...................... 324/508; 324/509; 324/522
(58) Field of Search ................................. 324/133, 506, 324/555, 556, 754, 508, 509, 522

(56) References Cited

U.S. PATENT DOCUMENTS

| | | | |
|---|---|---|---|
| 3,711,768 A | 1/1973 | Frazin | 324/507 |
| 3,753,090 A | 8/1973 | Tomek | 324/506 |
| 3,775,677 A | 11/1973 | Garrett et al. | 324/506 |
| 3,826,977 A * | 7/1974 | Woodworth | 324/556 |
| 4,041,380 A | 8/1977 | Epstein | 324/556 |
| 4,725,772 A * | 2/1988 | Peak | 324/66 |
| 4,857,826 A | 8/1989 | Graham | 324/508 |
| 5,285,163 A * | 2/1994 | Liotta | 324/508 |
| 5,406,207 A | 4/1995 | Shershen | 324/506 |
| 5,625,285 A * | 4/1997 | Virgilio | 324/133 |
| 6,054,849 A | 4/2000 | Collier et al. | 324/133 |
| 6,218,844 B1 * | 4/2001 | Wong et al. | 324/509 |
| 6,232,784 B1 | 5/2001 | Dulasky | 324/506 |
| 6,323,652 B1 * | 11/2001 | Collier et al. | 324/508 |
| 6,731,217 B1 * | 5/2004 | Warner | 340/650 |

* cited by examiner

*Primary Examiner*—Anjan Deb
*Assistant Examiner*—Walter Benson
(74) *Attorney, Agent, or Firm*—Richard C. Litman (57) ABSTRACT

An electrical continuity tester has a handheld housing having batteries, switch, test bulb, a probe and a power cord having a grounded plug on the end of the power cord. The handheld tester is used to first check that a common grounded outlet is wired properly by closing the switch and observing the test bulb. The test bulb should come on if the grounded outlet is wired properly. After the outlet has been verified, the probe can be used to touch any metal or conductive parts of any electrical device or appliance to verify that the metal part is properly grounded or wired to the hot side of the circuit. The cord and plug provides one connection for the tester and the probe provides the other connection.

11 Claims, 7 Drawing Sheets

ELECTRICAL CONTINUITY TESTER

BACKGROUND OF THE INVENTION

1. Field of the Invention

The present invention relates to a device for testing electrical continuity in electrical circuitry, and more specifically to a device for detecting proper grounding for all switches, receptacles, light fixtures, and appliances throughout the house or building before electrical power is applied to the house or building.

2. Description of the Related Art

Devices that test electrical continuity in electrical circuitry and that also check for proper grounding of electrical devices throughout the house or building often require that the electrical power be applied and turned on to the building or circuit under test. These devices, which sometimes include outlet plug adapters, require the circuit under test to be hot. Therefore, these devices cannot be used to verify the correct wiring of newly constructed houses or buildings by building inspectors or electricians before utility power is applied and turned on. Also, these devices cannot be used to test or diagnose faults due to wear and tear in old circuits when the fault is a short that prevents the circuit breaker or fuse from applying power to the circuit.

Other known devices can test electrical continuity in circuits that are not connected to a power source, but do not have a convenient means to plug into outlets while probing other circuit devices for proper wiring. Without such a convenient means, the inspector or electrician must use extra long jumper wires having alligator clips on each end, or a string of connected jumper wires having alligator clip ends in order to connect at least one probe of the continuity checker to a more remote device in the circuit. Also, alligator clip ends do not lend themselves to easy attachment to female contacts in outlets, or to grounded metal parts that do not have a shape which can be grabbed by the alligator clips.

U.S. Pat. No. 3,711,768, issued to Frazin on Jan. 16, 1973, and U.S. Pat. No. 3,775,677, issued to Garrett et al. on Nov. 27, 1973, each show a combined flashlight and continuity checker in one device. Although these devices have light bulb and battery elements and the alligator clips of a continuity checker, it does not have the convenience of a probe and a power cord with grounded plug.

U.S. Pat. No. 3,753,090, issued to Tomek on Aug. 14, 1973, and U.S. Pat. No. 5,406,207, issued to Shershen on Apr. 11, 1995, and U.S. Pat. No. 6,232,784, issued to Dulasky on May 15, 2001, also show a combined flashlight and continuity checker in one device. Although these devices have light bulb and battery elements and the short stubby probes of a continuity checker, they do not have the convenience of a probe and power cord with grounded plug.

U.S. Pat. No. 4,041,380, issued to Epstein on Aug. 9, 1977, shows a combined flashlight and continuity checker in one device. Although this device has light bulb and battery elements with the long probe and alligator clip end of a continuity checker, it does not have the convenience of a probe and power cord with grounded plug, as in the present invention.

U.S. Pat. No. 4,857,826, issued to Graham on Aug. 15, 1989, is continuity circuit checker which requires a circuit to be hot in order to carry out the testing and uses neon light bulbs to carry out the tests.

U.S. Pat. No. 6,054,849, issued to Collier et al. on Apr. 25, 2000, is continuity circuit checker for checking the continuity of electrical cables and cords having plugs on the ends. Thus the Collier device has many outlets to facilitate the testing.

It would be desirable to provide a device that can test electrical continuity in building or house circuits when power is not applied to the wiring, and which provides quick, convenient and secure means to make the necessary connections and contacts between the electrical devices in the circuit. It would also be desirable to provide a device that can test electrical continuity in a building circuit that is not restricted by the distance between two testing points.

None of the above inventions and patents, taken either singly or in combination, is seen to describe the instant invention as claimed. Thus, an electrical continuity tester solving the aforementioned problems is desired.

SUMMARY OF THE INVENTION

The present invention is an electrical continuity tester that solves the above problems by providing a handheld housing having batteries, switch, test bulb, a probe and a power cord having a three-prong plug, including a ground prong, on the end of the power cord. The handheld tester is used to first check that an unpowered grounded outlet is wired properly by closing the switch and observing the test bulb. The test bulb should come on if the grounded outlet is wired properly. After the outlet has been verified as wired properly, the probe can be used to touch any metal or conductive parts of any electrical device or appliance to verify that the metal part is properly grounded or properly wired to the hot side of the circuit, when the circuit is unpowered. Usually continuity tests require two connections of a continuity device to be made, but with the present invention the cord and plug provide one connection and the probe provides the other connection. Since the cord and plug are common and the outlets they plug into are available throughout the building or house, the range and reach of the handheld tester probe to the test points on the electrical devices are limitless.

Accordingly, it is a principal object of the invention to provide an electrical continuity tester that has no restrictions on its ability to test continuity between any two points in a circuit in a building.

It is another object of the invention to provide an electrical continuity tester that may be used with one hand once plugged into a verified common outlet.

It is a further object of the invention to provide an electrical continuity tester that can check continuity or proper wiring of a variety of electrical devices in an unpowered building.

Still another object of the invention is to provide an electrical continuity tester that can check continuity or proper wiring or short in an unpowered building or circuit.

It is an object of the invention to provide improved elements and arrangements thereof for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
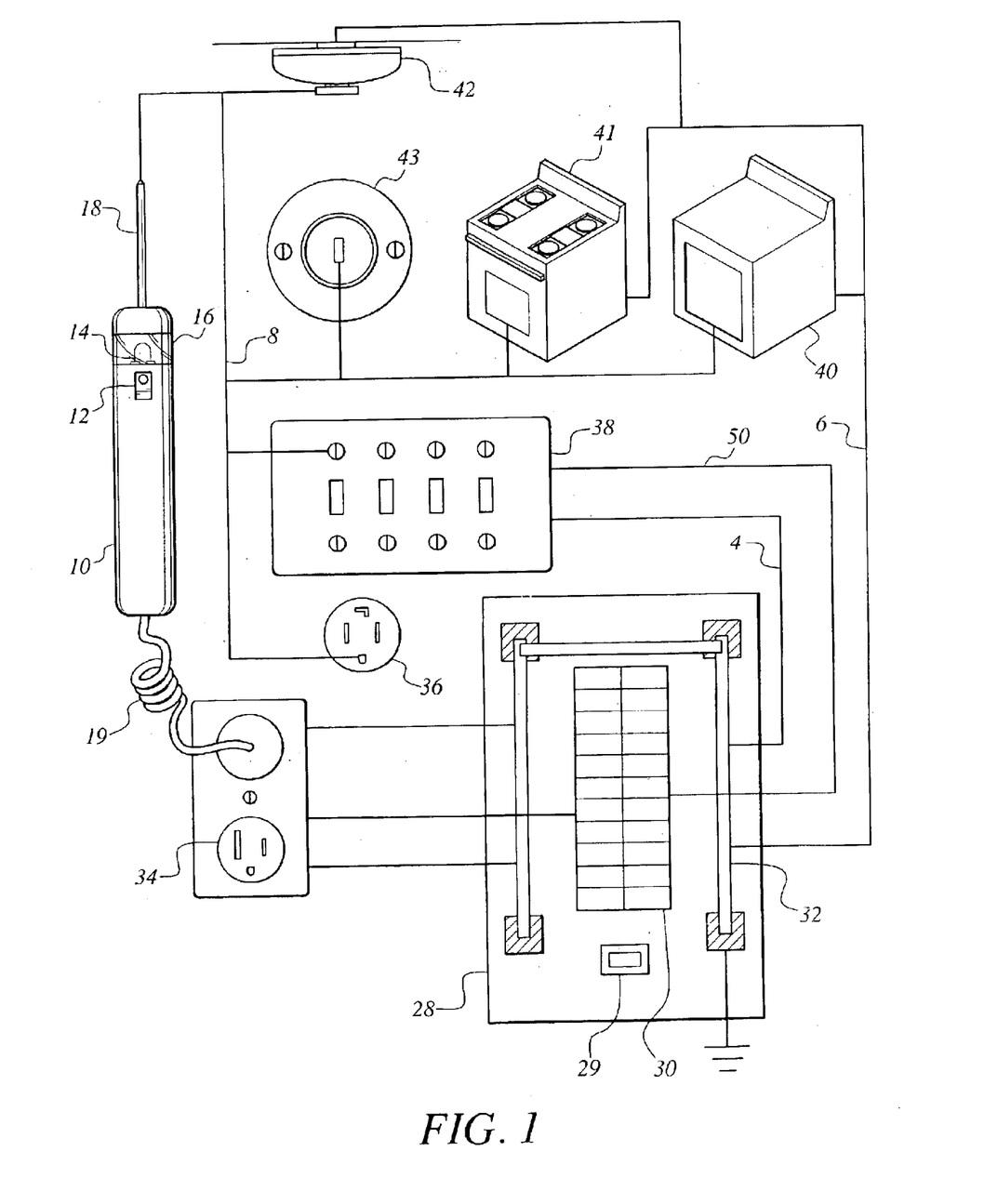
FIG. 1 is a schematic diagram of an electrical continuity tester, showing the manner of connecting the device to various circuits and appliances according to the present invention.
Figure 2:
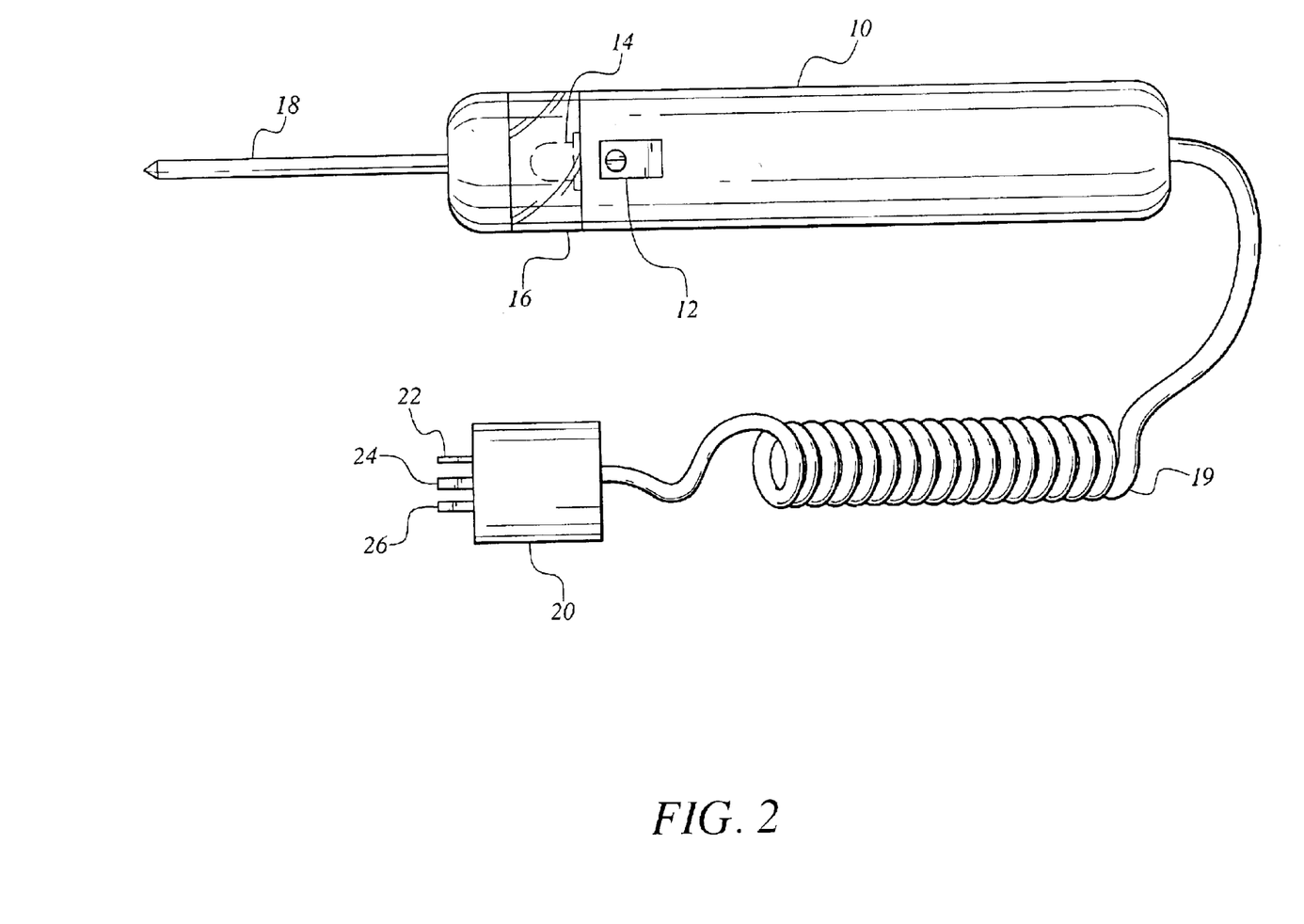
FIG. 2 is a perspective view of the electrical continuity tester with cord and grounded plug according to the present invention.

Referring to FIGS. 1 and 2, the continuity checker 10 has a probe 18, which is used to provide temporary connection under test to the electrical fixtures and appliances 36, 38, 40, 41, 42 and 43. The connecting line 8 illustrates the metal points on the electrical appliances 36, 38, 40, 41, 42 and 43 that the tip of the probe 18 touches while being tested by the electrician who is using the tester 10. Lines 4 and 6 illustrate some of the ground lines that connect metal parts on the electric range-oven 41, electric washer-dryer 40, and switch plate 38 to the ground-neutral bus bar 32 in the power main panel box 28.

Main cut off switch or circuit breaker 29 controls electric power and will typically be set in the off position during testing using the tester 10. Circuit breakers 30 control power to individual circuits throughout the house including circuits for the outlet 34, switches 38, light fixtures 42, light bulb socket 43, 220 volt, four-prong, female contact, grounded dryer outlet 36, range-oven 41 and dryer 40. Line 50 is an example of one of the hot side wirings, which is connected from the switches 38 to the circuit breaker 30 in the main power box 28. Outlet 34 is the typical 120-volt three-prong female contact grounded outlet used throughout U.S. houses and buildings. Switches 38 control power for further outlets 34 and fixed light fixtures 42.

Figure 3:
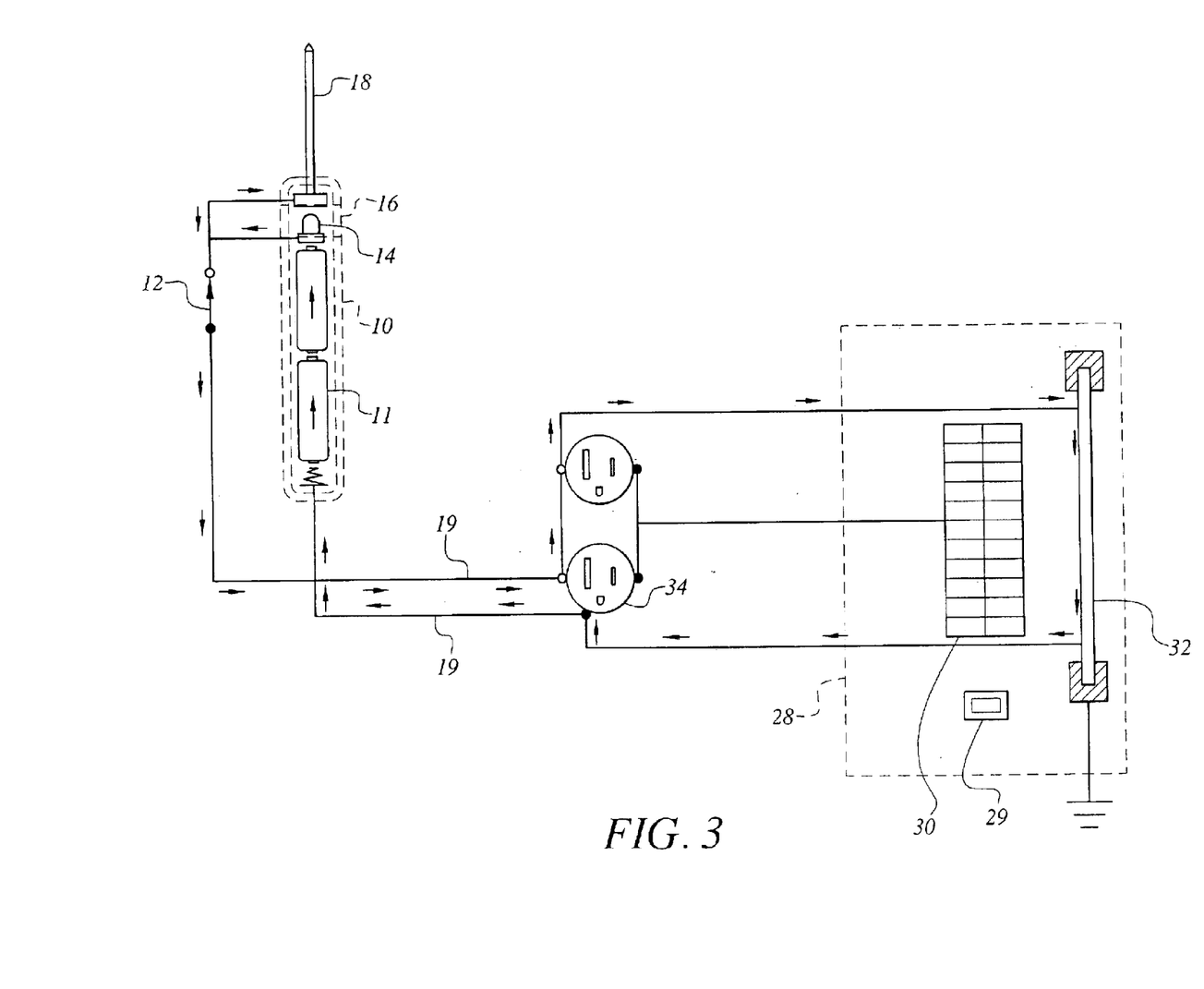
FIG. 3 is a detailed schematic of the electrical continuity tester during initial use and setup according to the present invention, the tester housing shown in phantom to show internal components.

In FIGS. 1 and 2, the continuity checker 10 uses a 15 foot recoilable cord 19 with three-prong grounded plug 20 on its end that is plugged into a three-prong female contact grounded outlet 34. The three-prong plug 20 has a ground prong 22, a neutral prong 24 and a hot prong 26 which mate with the female contacts in outlet 34 in only one way. The body of the tester 10 holds a pair of batteries inside a holder, a light bulb or L.E.D. 14, a lens 16, a switch 12 and a probe 18. The switch 12 provides control over the test modes. The lens 16 is a colored or transparent piece, which protects the light source 14, while allowing the light radiating from light source 14 to be visible. FIGS. 1 and 3 show how a properly wired three prong female contact 120 volt grounded outlet in any U.S. building or house is wired back to elements in the main electrical panel 28 according to the National Electrical Code.

FIG. 3 shows a schematic to illustrate the initial test mode that will test continuity and proper wiring of the outlet 34 while no power is applied to the building through the main circuit breaker 29. The batteries 11 are connected in series between one end of the light 14 and the ground prong 22 which, when mated to the ground female contact in outlet 34, allows for a circuit path back to the ground bus bar 32. The other end of the light 14 is connected to the switch 12 and the probe 18. The other side of the switch 12 is connected to the neutral prong 24, which is plugged into the neutral female contact in outlet 34, and which connects back to the ground or neutral bus bar 32. Thus, current flows from the battery 11, through the light 14, through the switch 12, through the neutral female contact of the outlet 34 through the neutral-ground bus bar 32, through the ground of the outlet 34 and back to the battery 11.

Once the switch 12 is turned on, the plug 20 is plugged into the outlet 34 and the probe 18 is not touching any object or device, the light 14 should come on if the outlet 34 has been wired correctly. When the switch 12 is closed (turned on) the circuit path between the light 14 and the batteries 11 is complete as shown by the arrows shown along the conductor lines. If the light 14 does not come on then the outlet 34 is not properly grounded and there is a break in the circuit. An outlet that tests bad cannot be used by the tester 10 for further tests of other devices.

Once an outlet 34 has been tested as wired correctly by the above procedure the tester 10 can be used to test further electrical devices. Assuming the outlet 34 is within a range of the length of the power cord 19 to the next electrical device to be tested and the switch 12 is turned off (open), then the user touches the probe 18 to metallic or conductive parts or areas of the electrical devices 36, 38, 40, 41, 42, 43 that should be grounded, as indicated by the light 14 turning on. When the switch 12 is turned off, and the user touches the probe 18 to metallic or conductive parts or areas of the electrical devices 36, 38, 40, 41, 42, 43 that should be hot, then the light 14 should remain off.

Figure 7:
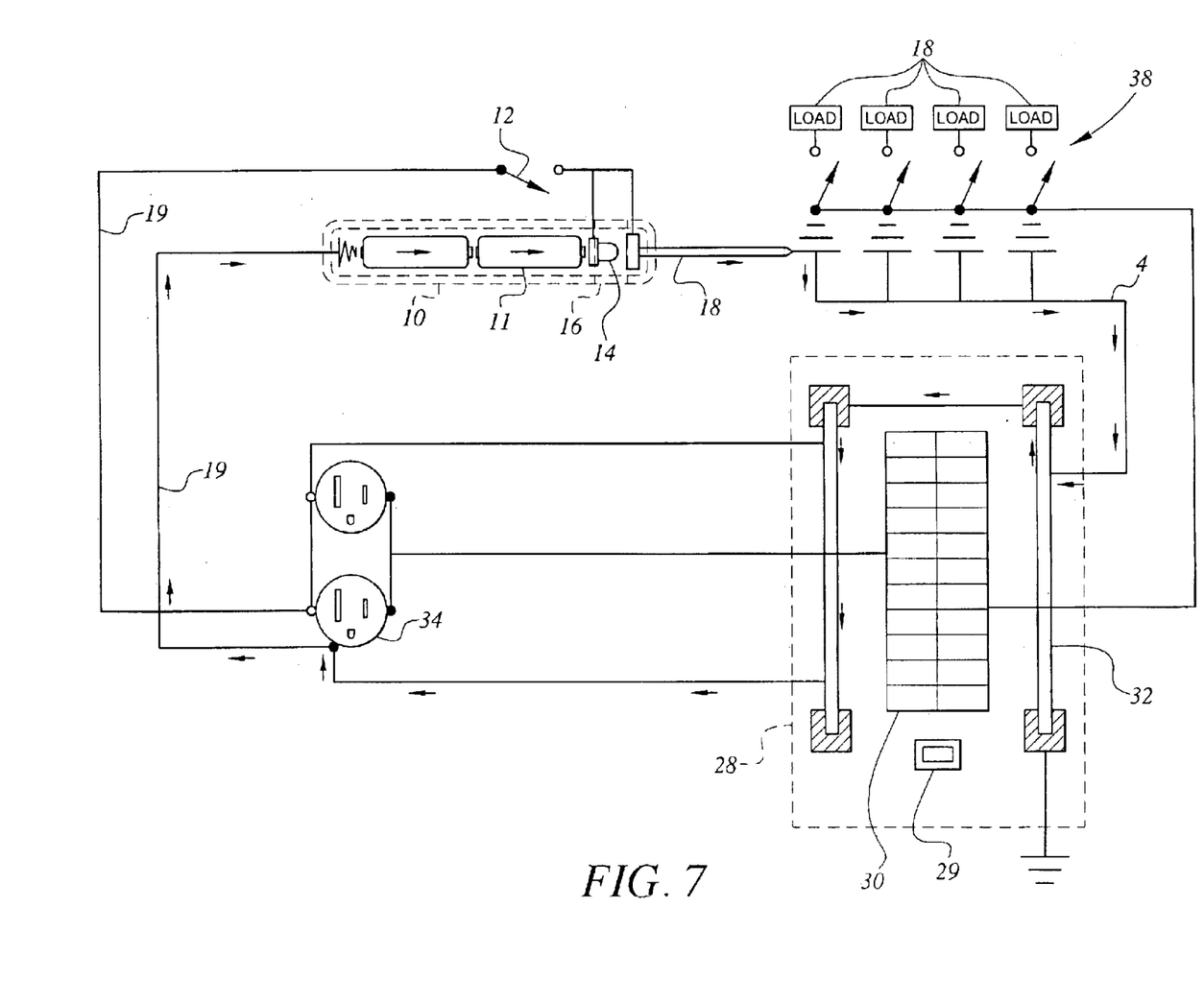
FIG. 7 is a detailed schematic of the electrical continuity tester testing a multiple switch assembly according to the present invention.

In the case of switches 38 in shown FIG. 1, the probe 18 touches the metal screws or metal plate of the switches 38 and the light 14 should come on indicating that the body of the switches 38 are properly wired for ground. FIG. 7 shows the circuit path for current flow from the batteries 11 through the light 14, through the probe 18, through the metal parts of the body of the switches 38 to the ground-neutral bus bar 32 to the ground of the outlet 34 through the plug 20 and cord 19 back to the batteries 11. Current through the open switch 12 on the tester 10 does not flow, so that the light 14 only turns on if there is continuity between the metal screws of the switch 38 face plate and the ground bus bar 32.

Figure 6:
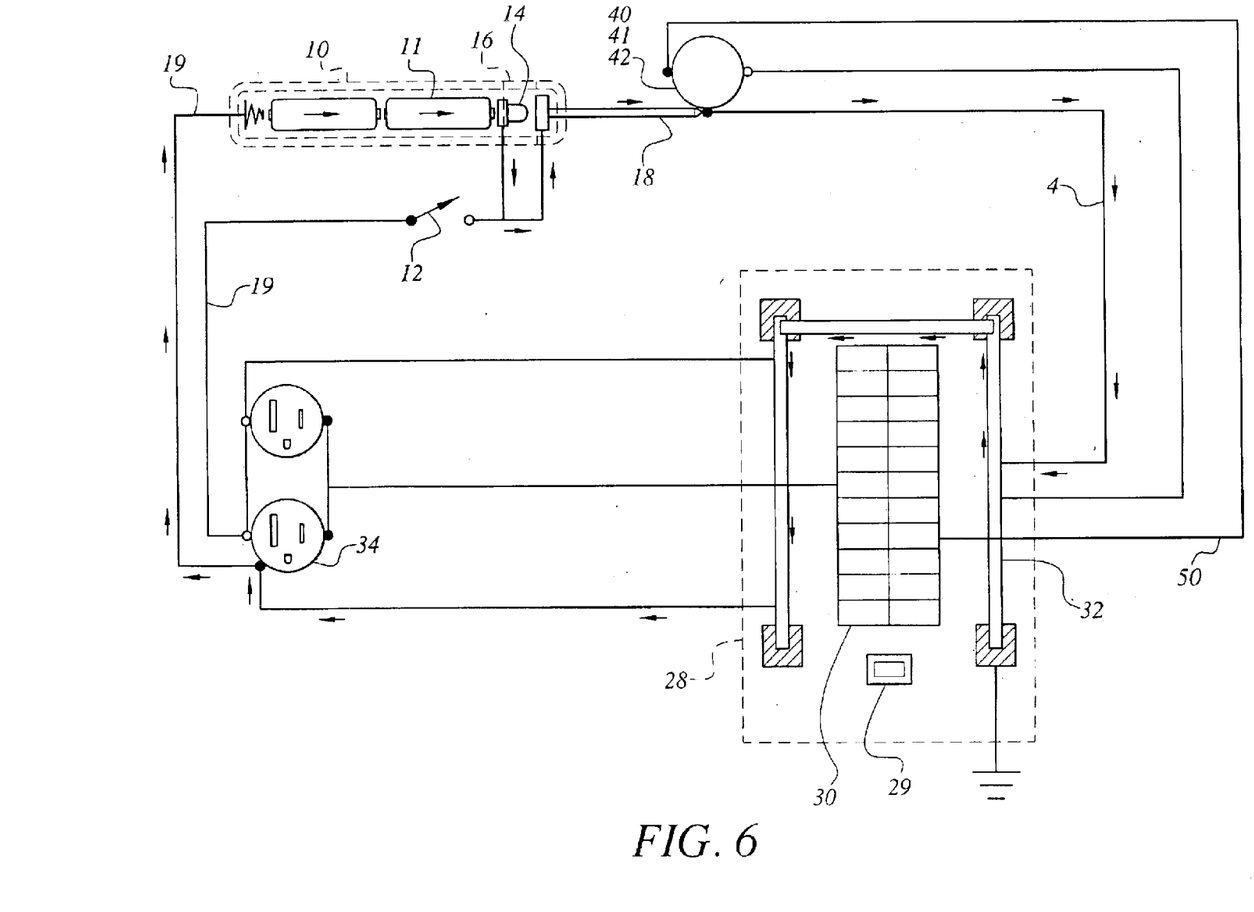
FIG. 6 is a detailed schematic of the electrical continuity tester testing a ceiling lamp, range-oven, washer-dryer, or other similar appliance, according to the present invention.

In the case of light fixtures 42 shown in FIG. 1, the probe 18 touches the grounded metal knob of the fixed light fixture 42 and the light 14 should come on indicating that the light fixture 42 is properly grounded. FIG. 6 shows the circuit path 4 for current flow from the batteries 11 through the light 14, through the probe 18, through the metal knob of the light fixture 42 to the ground-neutral bus bar 32 to the ground of the outlet 34 through the plug 20 and cord 19 back to the batteries 11.

In the case of electric range-oven 41 or washer-dryer 40 shown in FIG. 1 which have large portions or areas of metal parts that are supposed to be grounded, the probe 18 touches any of the areas of the metal parts of the range-oven 41 or washer-dryer 40 and the light 14 should come on indicating that these devices are properly wired for ground. FIG. 6 shows the circuit path 4 for current flow from the batteries 11 through the light 14, through the probe 18, through the metal parts of the range-oven 41 or washer-dryer 40 to the ground-neutral bus bar 32 to the ground of the outlet 34 through the plug 20 and cord 19 back to the batteries 11.

Figure 5:
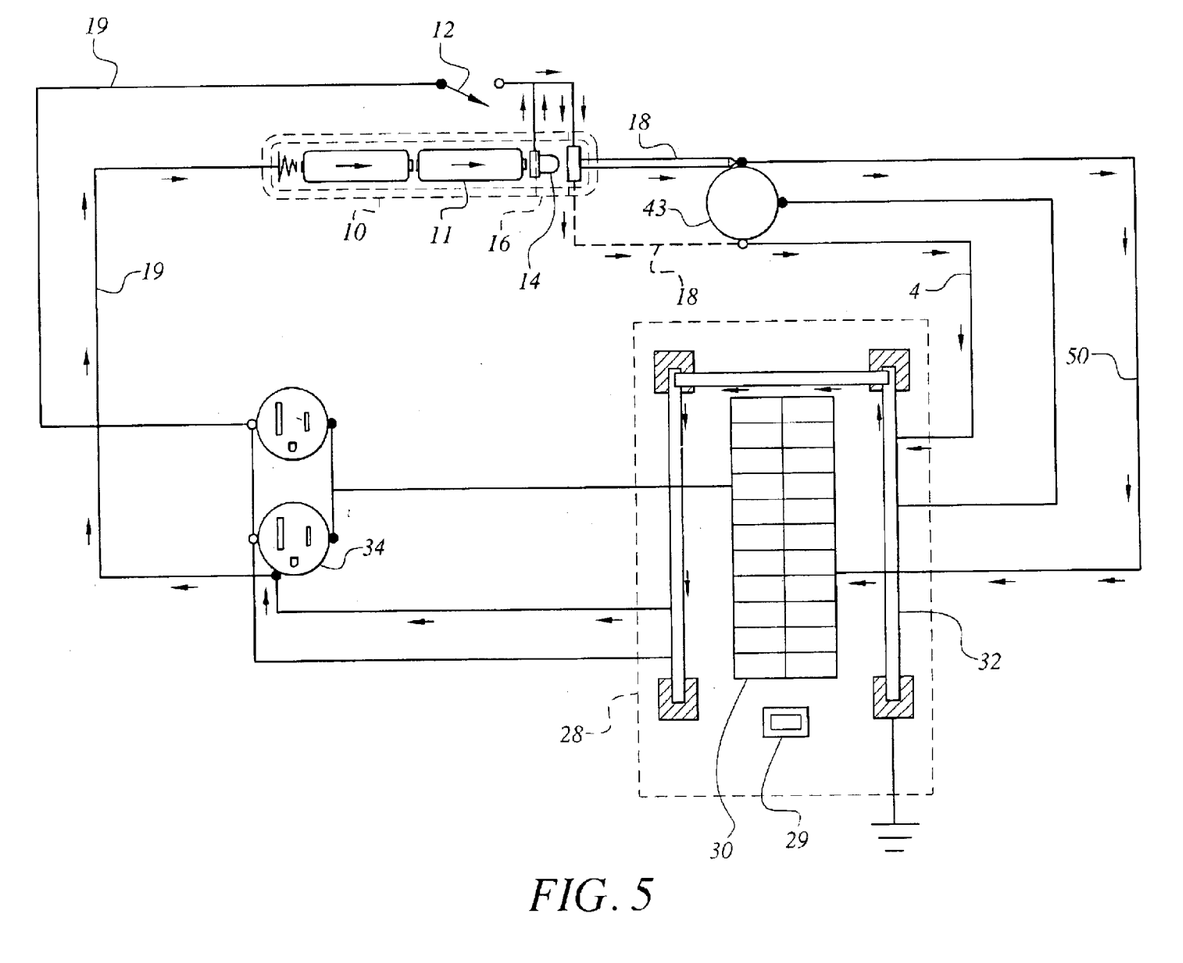
FIG. 5 is a detailed schematic of the electrical continuity tester testing a lamp socket according to the present invention.

In the case of a light fixture socket 43 shown in FIG. 1, the probe 18 touches the grounded metal screws of the light socket 43 and the light 14 should come on indicating that the light socket 43 is properly wired for ground. FIG. 5 shows the circuit path 4 for current flow from the batteries 11 through the light 14, through the probe 18, through the metal screws holding the light socket 43 through the ground-neutral bus bar 32 to the ground of the outlet 34 through the plug 20 and cord 19 back to the batteries 11. Then, the probe 18 is held to touch the brass colored rectangular hot contact in the light socket 43 as shown in FIG. 1 and the light 14 should stay off indicating the correct wiring of the hot side wiring of the light socket 43. FIG. 5 shows the circuit path for current flow from the batteries 11 through the light 14, through the probe 18 (touching the hot line) though the hot line 50 to stop and go no further than the circuit breaker 30.

Figure 4:
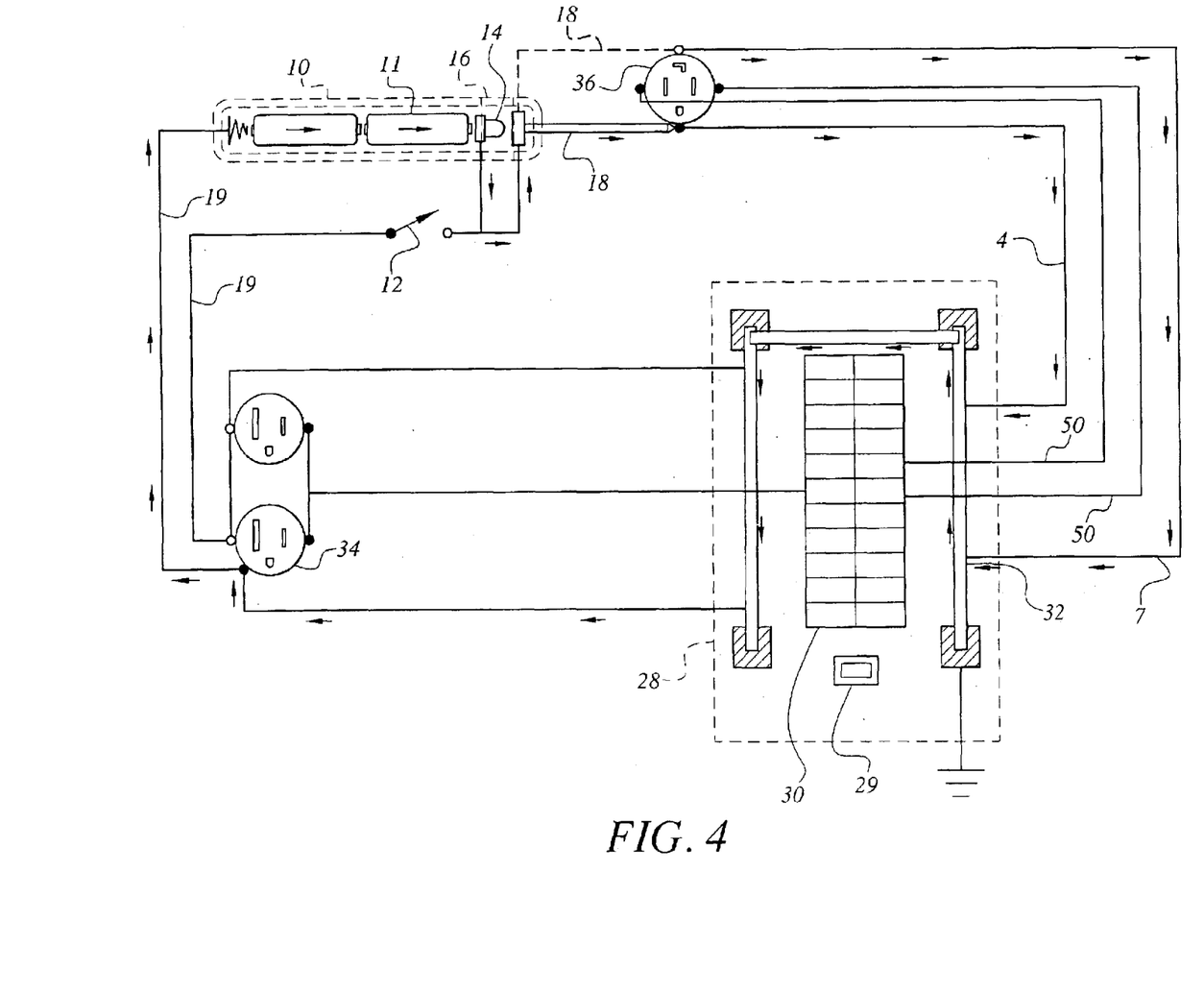
FIG. 4 is a detailed schematic of the electrical continuity tester testing a four-prong 220-volt electrical appliance outlet according to the present invention.

In the case of a grounded 220 volt dryer outlet 36 as shown in FIG. 1, the probe 18 touches the grounded female contact or screw of the grounded 220 volt dryer outlet 36 and the light 14 should come on indicating it is properly wired for ground. FIG. 4 shows the circuit path 4 for current flow from the batteries 11 through the light 14, through the probe 18 (dotted line 18), through the grounded female contact or screw of the ground dryer plug 36 through the ground-neutral bus bar 32 to the ground of the outlet 34 through the plug 20 and cord 19 back to the batteries 11.

Then, the probe 18 is held to touch the neutral female contact or screw in the grounded dryer outlet 36 as shown in FIG. 1 and the light 14 should be on indicating the correct wiring of the neutral line 7 in the dryer plug 36. FIG. 4 shows the circuit path 7 for current flow from the batteries 11 through the light 14, through the probe 18 (touching the neutral line) though the ground-neutral bus bar 32 to the ground of the outlet 34 through the plug 20 and cord 19 back to the batteries 11. The two hot side wirings 50 can also be tested in the same manner as mentioned above with respect to FIG. 5 by touching the probe 18 to the two hot side female contacts in the outlet 36.

As one of ordinary skill in the art, including electricians, building inspectors and electrical engineers, can see, the advantage to the present invention is the handheld device 10 and its one long power cord 19 and plug 20 to test an infinite variety of electrical devices in the building before power is applied, or when power is disconnected, or when power is not turned on. Thus, the user of the tester 10 does not have to rely on jumper cables or wires that are strung together and have alligator clip ends that are often inconvenient or which easily come loose. The three-prong plug 20 and cord 19 of the tester 10 can even be extended by conventional extension cords. Also, adaptors for alligator clips to hold on to the female contacts of other kinds outlets do not have to made because of the long probe 18 on tester 10.

In the case of outlets or switches, cover plates never have to be removed to check for proper grounding, since the probe tip 18 can touch the smallest area of metal part even if it is the screw in a plastic cover plate. Such operations with the probe 18 and long power cord 19 are one-handed avoiding two-handed situations when the alligator clips are not securely attached or have long pulls on their wire. The one-handed operation and probe 18 free the inspector or electrician to test all the metal areas on large electrical appliances 40, 41 such as stoves, ovens, washers, dryers, furnaces, main circuit panel boxes, etc. even when the metal areas are separated by plastic areas.

The tests with the probe 18 and tester 10 allow for further tests to show correct wiring of the hot wire of the electrical devices while utility power is not applied. Thus, the device of the present invention can be used with all the conveniences as mentioned above during the testing and locating of a short in the wiring or devices connected in the circuit when the power is removed and cannot be applied because of the short.

FIGS. 1 and 2 show how a properly wired three prong female contact 120 volt grounded outlet in any building is wired back to elements in the main electrical panel 28 according to the NFPA (National Fire Protection Association) 70, NEC (National Electrical Code). The tester of the present invention also provides pass-fail testing of the proper grounding of electrical devices according to the NEC (National Electrical Code). The NEC is a set scientifically and consensus based codes and standards having a long list of organizations on the code making panel.

It is to be understood that the present invention is not limited to the embodiments described above, but encompasses any and all embodiments within the scope of the following claims.

I claim:

1. An electrical continuity tester, comprising:

a handheld case;

a portable source of power contained within said handheld case;

a switch mounted on said handheld case, the switch having first and second contacts;

a light source mounted inside said handheld case viewable outside said hand held case and electrically coupled between said portable source of power and said switch;

a probe mounted on the outside of said haudheld case and electrically coupled to the first contact of said switch and to said light source; and a three-wire electrical cord having a three-prong plug attached to one end of the cord, the plug having a hot prong, a neutral prong, and a ground prong, one of the wires being electrically coupled between the second contact of said switch and the neutral prong of a plug, and a second of the three wires being electrically coupled between an opposite end of said power source and the ground prong of said plug.

2. The electrical continuity tester as claimed in claim 1, wherein said electrical cord is at least fifteen feet long.

3. The electrical continuity tester as claimed in claim 1, wherein said plug is a standard three prong 120 volt plug capable of mating with an electrical outlet.

4. The electrical continuity tester as claimed in claim 1, wherein said portable power source comprise dry cell batteries.

5. The electrical continuity tester as claimed in claim 1, wherein said light source is an LED.

6. An electrical continuity tester, comprising:

a portable power source having first and second ends;

a switch, the switch having first and second contacts;

a visable light source electrically coupled between the first end of said portable power source and the first contact of said switch;

a probe electrically coupled to the first contact of said switch and to said light source; and a three-wire electrical cord having a three-prong plug attached to one end of the cord, the plug having a hot prong, a neutral prong, and a ground prong, one of the wires being electrically coupled between the second contact of said switch and the neutral prong of a plug, and a second of the three wires being electrically coupled between the second end of said power source and the ground prong of said plug.

7. The electrical continuity tester as claimed in claim 6, wherein said electrical cord is at least fifteen feet long.

8. The electrical continuity tester as claimed in claim 6, wherein said plug is a standard three prong 120 volt plug capable of mating with an electrical outlet.

9. The electrical continuity tester as claimed in claim 6, wherein said portable power source comprise dry cell batteries.

10. The electrical continuity tester as claimed in claim 6, wherein said light source is an LED.

11. The electrical continuity tester as claimed in claim 6, further comprising a handheld case, wherein said power source is contained within said handheld case, said switch is mounted on said handheld case, said visable light source is mounted inside said handheld case and is viewable from outside said hand held case, and said probe is mounted on the outside of said handheld case.

\* \* \* \* \*